United States Patent [19]

Kojima et al.

[11] 4,223,337
[45] Sep. 16, 1980

[54] SEMICONDUCTOR INTEGRATED CIRCUIT WITH ELECTRODE PAD SUITED FOR A CHARACTERISTIC TESTING

[75] Inventors: Hideto Kojima; Hisashi Funakoshi, both of Tokyo, Japan

[73] Assignee: Nippon Electric Co., Ltd., Tokyo, Japan

[21] Appl. No.: 942,730

[22] Filed: Sep. 15, 1978

[30] Foreign Application Priority Data

Sep. 16, 1977 [JP] Japan .................................. 52-112064

[51] Int. Cl.² .................... H01L 23/48; H01L 29/44; H01L 29/52
[52] U.S. Cl. ........................................ 357/68; 357/65; 357/46; 357/71; 307/315
[58] Field of Search .................. 357/65, 68, 70, 71, 357/46; 307/315

[56] References Cited

U.S. PATENT DOCUMENTS

| 3,274,667 | 9/1966 | Siebertz | 357/68 |
| 3,558,992 | 1/1971 | Heuner et al. | 357/68 |
| 3,676,922 | 7/1972 | Cook | 357/68 |
| 3,761,787 | 9/1973 | Davis et al. | 357/51 |
| 4,010,488 | 3/1977 | Gruszka et al. | 357/70 |

FOREIGN PATENT DOCUMENTS

| 1231042 | 5/1971 | United Kingdom | 357/68 |
| 1315922 | 5/1973 | United Kingdom | 357/68 |

Primary Examiner—Andrew J. James
Attorney, Agent, or Firm—Sughrue, Rothwell, Mion, Zinn and Macpeak

[57] ABSTRACT

An integrated circuit device is provided with a divided electrode pad which permits checking the electrical characteristics of individual circuit elements before assembly into a package housing. After testing, the divided electrode pad is connected by thermally bonding one end of a single lead wire or the like to the divided parts.

10 Claims, 3 Drawing Figures

SEMICONDUCTOR INTEGRATED CIRCUIT WITH ELECTRODE PAD SUITED FOR A CHARACTERISTIC TESTING

BACKGROUND OF THE INVENTION

This invention relates to a wiring pattern or a wiring arrangement of a semiconductor integrated circuit, particularly to an electrode pad of the wiring pattern.

In general, a semiconductor integrated circuit is constructed by forming a plurality of circuit elements, such as transistors and resistors, on a semiconductor chip and wiring the circuit elements to form an electrical circuit. The wiring is formed by a metal or silicon wiring layer. At some portions of the metal wiring layer such as power supplying portions and input and output portions which need connection to an external circuit or element, electrode pads are formed and connected to a lead provided on package by fine metal wire.

An electrical characteristic checking of such integrated circuit is performed by observing a voltage or a current between two electrode pads or two leads. It is, however, difficult to check the electrical characteristics of individual circuit elements, particularly such elements forming a feed-back loop requiring no external elements.

Further, semiconductor integrated circuit devices are manufactured in the following manner. That is, a plurality of integrated circuits are formed on one semiconductor wafer, and the wafer is divided into individual integrated circuit chips. A chip is fixed in a package, and the electrical connection between electrode pads of the chip and leads of the package are formed by wire-bonding, and then the package is hermetically sealed. In such manufacturing process, it is preferable in view of cost saving to find and remove defective chips in an earlier step, because the additional manufacturing cost can be saved.

Now, the checking of D.C. characteristics can be conventionally achieved for a plurality of integrated circuits on one semiconductor wafer, while that of A.C. characteristics such as noise figure (NF) cannot be examined before chips are housed in the packages. This is because the electrical characteristics of the integrated circuit on the wafer are easily affected by external noise and precise electrical data cannot be obtained due to large junction capacitance and because a longer time period for checking is required than the D.C. characteristic checking. Instead of A.C. characteristic checking, it is possible to estimate the A.C. characteristics by checking the D.C. characteristics of individual circuit elements. That is, however, also impossible on the conventional integrated circuit because the individual element checking is impossible.

SUMMARY OF THE INVENTION

Therefore, the principal object of this invention is to provide an integrated circuit device having an improved electrode pad on the chip and being able to check the electrical characteristics of individual circuit elements. An additional object of this invention is to provide an integrated circuit applicable to A.C. characteristic checking in the manufacturing step before the wafer is divided into individual integrated circuit chips.

The semiconductor integrated circuit device of this invention comprises a semiconductor chip on which a plurality of circuit elements are formed, a conductive layer wiring the circuit elements to form an electrical circuit, a package having external leads in which the semiconductor chip is attached, and means for connecting between the predetermined portions of the wiring layer and the external leads. Electrode pads are connected to the predetermined portions of the wiring layer. At least one of the electrode pads is divided into at least two parts disposed separately and connected to the different circuit elements respectively. The parts are connected to each other by one end of the connecting means.

According to this invention, because the electrode pads are divided into plural parts, the electrical checking of the individual circuit elements may be achieved before the electrical connection between the electrode pads and the external leads are provided, especially before the semiconductor wafer is divided into individual integrated circuit chips. Therefore, the defective chip can be discovered and removed in the earlier manufacturing step, thereby saving the additional manufacturing cost. Further, the A.C. characteristic check may be achieved by estimating it from the D.C. characteristics of individual circuit elements. For example, the noise figure (NF) may be estimated from the D.C. current gain (hFE) of a composed transistor. Furthermore, the semiconductor integrated circuit devices do not require additional manufacturing steps and additional circuit elements or wiring layers, as compared with the conventional semiconductor integrated circuit devices, resulting in easy production of integrated circuits.

BRIEF DESCRIPTION OF THE DRAWINGS

The above and other objects and features of the invention will become apparent from the following description taken in conjunction with the accompanying drawings, wherein.

DETAILED DESCRIPTION OF THE INVENTION

Figure 1:
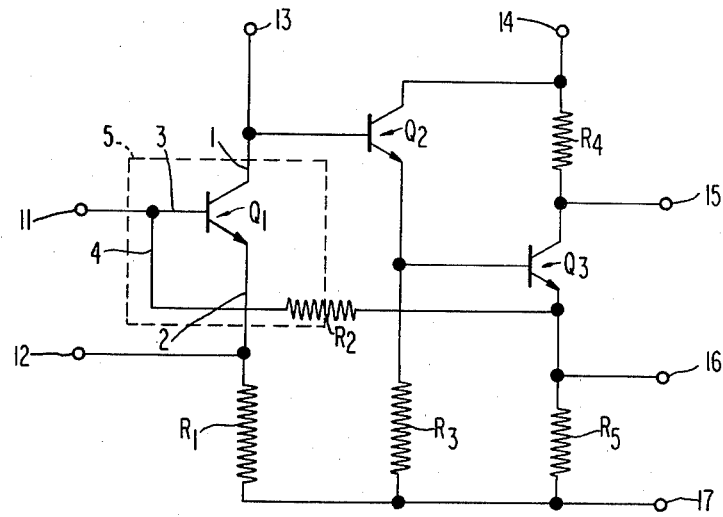
FIG. 1 is a circuit diagram of one integrated circuit device for illustrating the conventional integrated circuit device and one embodiment of the invention.

Referring now to FIG. 1 showing an example of circuit configuration formed in a semiconductor integrated circuit, an input signal is received at the input terminal 11, amplified by the NPN transistors $Q_1$, $Q_2$, and $Q_3$ and derived as an output signal from the output terminal 15. The emitter resistors $R_1$, $R_3$, and $R_5$ are respectively inserted between the emitters of the transistors $Q_1$, $Q_2$, and $Q_3$ and ground terminal 17. The resistor $R_2$ is inserted between the base of the transistor $Q_1$ and the emitter of the transistor $Q_3$ to form a feedback loop. The resistor $R_4$ connects the collectors of the transistors $Q_2$ and $Q_3$. External bypass capacitors (not shown) are connected between the terminals 12 and 17 and between the terminals 16 and 17. External loads (not shown) are connected between the terminal 13 and power supply (not shown) and between the terminal 14 and power supply. The reference numerals 1 to 4 indicate wirings and are given for explaining the prior art and this invention.

In the semiconductor integrated circuit, the transistors $Q_1$, $Q_2$ $Q_3$ and the resistors $R_1$, $R_2$, $R_3$, $R_4$ and $R_5$ are formed on one semiconductor chip, and wirings between these circuit elements are formed by a metal wiring layer. At the portions of the wiring layer corresponding to the terminals 11 to 17, electrode pads are formed. This semiconductor chip is attached on a stem of package having seven external leads, for example. The electrical connection between the electrode pads and the external leads is provided by thermally bonding fine metal wires. Thereafter the package is tightly sealed.

Figure 2:
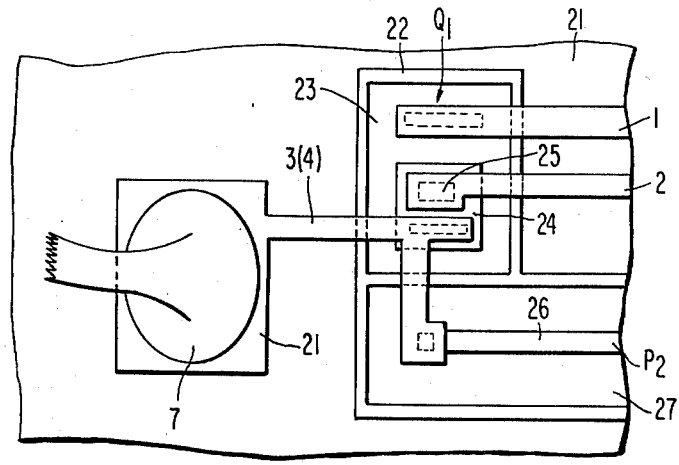
FIG. 2 is a top view of one part of the conventional integrated circuit.

One part of the semiconductor chip of the conventional semiconductor integrated circuit corresponding to the part 5 surrounded by dashed line in FIG. 1 is shown in FIG. 2. A semiconductor chip 21 comprises a P type substrate and N an type expitaxial layer deposited thereon. The N type epitaxial layer is electrically divided into several regions by a P+ type isolation region 22. The transistor $Q_1$ is formed in the region 23 by forming a P type base region 24 and an N type emitter region 25, and the resistor $R_2$ in the region 27 by forming a P type region 26. A silicon dioxide layer having openings for electrical connection covers on the upper surface of the chip 21. Wiring layer 1, 2, and 3 (4) and electrode pad 21 of aluminium are selectively deposited on the silicon dioxide layer. The electrode pad 21 is connected to the external lead of the package by aluminium or gold fine wire 7 bonded at both ends by thermal bonding.

The electrode pad 21 is a single area connected to both the base and the transistor $Q_1$ and the resistor $R_2$. The other electrode pads are formed similarly. Therefore, the electrical characteristics of the single transistor $Q_1$ cannot be checked so that the checking of the A.C. characteristics of the integrated circuit is compelled to be performed after the integrated circuit chip is mounted on the package and then the package is sealed. This results in a loss of a large manufacturing cost if the defective chip is discovered. It is needless to say that the estimation of A.C. characteristics from the D.C. characteristics is also impossible because the D.C. characteristics of the individual transistor cannot be observed.

Figure 3:
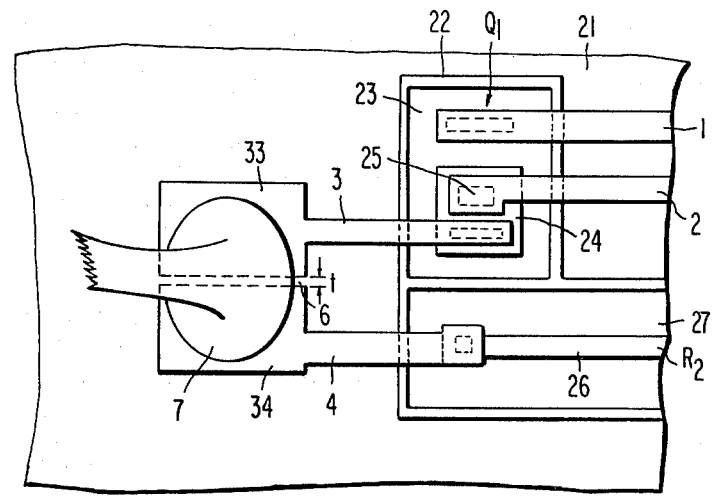
FIG. 3 is a top view of one part of one embodiment according to this invention.

Referring now to FIG. 3, one part of the preferred embodiment according to this invention is shown. The part shown in FIG. 3 corresponds to the part 5 surrounded by dashed line in FIG. 1. The parts except for wiring layers 3 and 4 and electrode pads 33 and 34 are constructed similarly to the conventional integrated circuit described with reference to FIG. 2. Therefore, the detailed description is neglected by giving the same reference numerals as in FIG. 2. The terminal 11 (shown in FIG. 1) has two divided electrode pads 33 and 34 disposed separately. The electrode pad 33 is connected to the base of the transistor $Q_1$ by the wiring 3, and the electrode pad 34 to the resistor $R_2$ by the wiring 4. The interval "t" of the gap 6 between the electrode pads 33 and 34 is selected to the range between 5 and 10 $\mu$m.

A plurality of integrated circuits having a portion shown in FIG. 3 are formed on a semiconductor wafer. After the D.C. characteristic checking is performed on each integrated circuit and on the composed elements such as transistor $Q_1$ and resistor $R_2$, the semiconductor wafer is divided into individual integrated circuit chips. A divided chip is mounted on a stem of package having seven external leads (for example), and then the aluminium or gold fine wires 7 are thermally bonded on the electrode pads of the chip and the external leads of the package to form the electrical connection therebetween. The bonding of the wire 7 on the electrode pads 33 and 34 is formed so that the bonded end of the wire 7 covers the gap 6 and connects electrically between the electrode pads 33 and 34. In this step, if the gap 6 is too long, the electrical connection between the pads 33 and 34 becomes difficult, while if the gap is too short, the perfect separation between the pads 33 and 34 is not obtained due to imperfections of etching.

According to the above one embodiment, the electrical characteristic check is performed on the individual transistor $Q_1$ by applying probes of test equipment to the terminals 12 and 13 and the electrode pad 33, before electrodes 33 and 34 are connected together by wire 7. It is a fact that, because the electric shielding of the chip 21 is not effective in the manufacturing step that the wire bonding is not performed, external noise is easily introduced into the circuit in the chip 21 making it impossible to precisely check A.C. characteristics such as noise figure (NF). However, there is a mutual relation in the discrete transistor between the noise figure (NF) and the D.C current gain (hFE), and the noise figure NF of the first stage transistor $Q_1$ is dominant in an integrated circuit. Therefore, the noise figure (NF) of the integrated circuit can be estimated from the noise figure (NF) of the first stage transistor $Q_1$ which is estimated from the D.C. current gain (hFE). In this way, the test may be achieved with respect to not only D.C. characteristics but also A.C. characteristics.

This test is also possible on the semiconductor wafer before the semiconductor wafer formed with a plurality of integrated circuits thereon is divided into individual integrated circuit chips. This results in discovering the defective integrated circuits in the earlier manufacturing step and in saving the subsequent manufacturing cost.

Further, the integrated circuit of this embodiment can be easily manufactured by slightly changing on the etching mask for forming the wiring layers 1, 2, 3, and 4 and electrode pads 33 and 34 resulting in no requirement of additional manufacturing steps compared to that of comventional integrated circuit.

It is effective to form the divided electrode pad at the input terminal, because the noise figure (NF) of the first stage transistor is dominant. However, the divided electrode pads may also be formed at the other terminal, such as terminals connected to the feed-back loops. The bonding wire 7 may be replaced by metal ribbon, metal plate or the like. The metal ribbon or the metal plate is bonded on the electrode pads 33 and 34 by solder. In this case the interval "t" of the gap can be elongated. It is needless to say that the figure of electrode pads 33 and 34 is not limited to a rectangle but may be formed in other geometrical shapes such as a square, a circle, a semicircle, or the like.

What is claimed is:
1. A semiconductor device comprising:
a semiconductor chip having a plurality of circuit elements formed therein;
a conductor layer formed on said semiconductor chip and interconnecting said circuit elements;
electrode pads connected to said conductor layer, at least one of said electrode pads including a plurality of separate parts, and said separate parts being connected to different circuit elements and disposed close to each other; said conductor layer and said circuit elements interconnected by said conductor layer forming a predetermined incomplete electrical circuit lacking a connection between said separate parts;

a package housing said semiconductor chip and having a plurality of external leads; and means for electrically connecting said electrode pads with said external leads, one end of said electrically connecting means interconnecting said separate parts of said at least one electrode pad thereby completing said predetermined electrical circuit.

2. A semiconductor device claimed in claim 1, wherein said separate parts of said at least one electrode pad are separated by an interval between 5 μm and 10 μm.

3. A semiconductor device claimed in claim 1 or claim 2, wherein said at least one electrode pad is an input electrode pad for receiving an input signal.

4. A semiconductor device claimed in claim 1 or claim 2, wherein said at least one electrode pad is connected to a portion of said conductor layer forming a feed-back loop together with said circuit elements.

5. An integrated circuit chip comprising:
a plurality of circuit elements formed therein:
a conductor layer formed on said integrated circuit chip and interconnecting said circuit elements to form a predetermined electrical circuit; and
electrode pads connected to said conductor layer, at least one of said electrode pads including a plurality of separate parts, said separate parts being juxtaposed and connected to different circuit elements and means for directly electrically connecting said separate parts to form the completed electrical circuit.

6. A semiconductor device claimed in claim 5, wherein said separate parts of said at least one electrode pad are separated by an interval between 5 μm and 10 μm.

7. A semiconductor device claimed in claims 5 or 6, wherein said at least one electrode pad is an input electrode pad for receiving an input signal.

8. A semiconductor device claimed in claims 5 or 6, wherein said at least one electrode pad is connected to a portion of said cnductive layer forming a feed-back loop together with said circuit elements.

9. A semiconductor device claimed in claim 1, wherein at least one of said separated parts of said at least one electrode pad is adapted to receive a probe of an electrical testing device.

10. A semiconductor device comprising:
a semiconductor chip having a plurality of circuit elements formed therein;
a plurality of electrode pads formed on said semiconductor chip;
means for interconnecting said circuit elements and said electrode pads, at least two of said electrode pads being closely juxtaposed and isolated from each other to prevent completion of a predetermined electrical circuit to be formed by said circuit elements until at least one of said circuit elements is tested by use of said electrode pads; and
an electrical conductor bonded to both said at least two juxtaposed electrode pads to complete said predetermined electrical circuit after said test.

* * * * *

UNITED STATES PATENT AND TRADEMARK OFFICE
CERTIFICATE OF CORRECTION

PATENT NO. : 4,223,337
DATED : September 16, 1980
INVENTOR(S) : Hideto KOJIMA et al.

It is certified that error appears in the above—identified patent and that said Letters Patent is hereby corrected as shown below:

Column 1, line 52, delete "That" and insert -- This -- .

Column 2, line 67, delete "$Q_2Q_3$" and insert -- $Q_2$ and $Q_3$ -- .

Column 3, line 14, delete "expitaxial" and insert -- epitaxial -- ;

line 21, after "covers" delete "on" .

Column 4, line 36, after "changing" delete "on" ;

line 44, delete "may also be" and insert -- may be also -- .

Signed and Sealed this

Third Day of March 1981

[SEAL]

Attest:

RENE D. TEGTMEYER

Attesting Officer    Acting Commissioner of Patents and Trademarks